(12) United States Patent
Ganesan et al.

(10) Patent No.: US 12,224,245 B2
(45) Date of Patent: Feb. 11, 2025

(54) EMBEDDED DIE ARCHITECTURE AND METHOD OF MAKING

(71) Applicant: Intel Corporation, Santa Clara, CA (US)

(72) Inventors: Sanka Ganesan, Chandler, AZ (US); Robert L. Sankman, Phoenix, AZ (US); Sri Chaitra Jyotsna Chavali, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 727 days.

(21) Appl. No.: 16/724,907

(22) Filed: Dec. 23, 2019

(65) Prior Publication Data

US 2021/0193579 A1 Jun. 24, 2021

(51) Int. Cl.
*H01L 23/538* (2006.01)
*H01L 21/768* (2006.01)
*H01L 23/498* (2006.01)

(52) U.S. Cl.
CPC .... *H01L 23/5384* (2013.01); *H01L 21/76802* (2013.01); *H01L 23/49816* (2013.01); *H01L 23/5381* (2013.01); *H01L 23/5386* (2013.01)

(58) Field of Classification Search
CPC ........... H01L 23/5384; H01L 23/49816; H01L 23/5381; H01L 23/5386; H01L 23/481;
(Continued)

(56) References Cited

U.S. PATENT DOCUMENTS 9,337,138 B1* 5/2016 Abugharbieh ........ H01L 23/642
10,535,608 B1* 1/2020 Rubin ..................... H01L 24/17
(Continued)

FOREIGN PATENT DOCUMENTS

CN 113097199 7/2021
DE 102020130872 6/2021
(Continued)

OTHER PUBLICATIONS

"Indian Application Serial No. 202044041703, First Examination Report dated May 18, 2022", 6 pgs.

*Primary Examiner* — Dao H Nguyen
(74) *Attorney, Agent, or Firm* — Akona IP PC

(57) ABSTRACT

Various examples provide a semiconductor package. The semiconductor package includes a substrate having first and second opposed substantially planar major surfaces extending in an x-y direction. The package further includes a bridge die having third and fourth opposed substantially planar major surfaces extending in the x-y direction. The third substantially planar major surface of the bridge die is in direct contact with the second substantially planar major surface of the substrate. The semiconductor package further includes a through silicon via extending in a z-direction through the first substantially planar major surface of the substrate and the fourth substantially planar major surface of the bridge die. The semiconductor package further includes a power source coupled to the through silicon via, a first electronic component electronically coupled to the bridge die, and a second electronic component electronically coupled to the bridge die. The semiconductor package further includes an overmold at least partially encasing the first electronic component, second electronic component, and the bridge die.

22 Claims, 2 Drawing Sheets

(58) Field of Classification Search
CPC ......... H01L 21/76802; H01L 21/76898; H01L 25/50; H01L 25/18; H01L 25/0655; H01L 2224/1403; H01L 2224/17; H01L 2224/73204

See application file for complete search history.

(56) References Cited

U.S. PATENT DOCUMENTS

| | | | |
|---|---|---|---|
| 10,593,628 B2 * | 3/2020 | Bhagavat | H01L 23/49838 |
| 11,569,172 B2 * | 1/2023 | Hou | H01L 23/5381 |
| 2007/0181991 A1 * | 8/2007 | Ishino | H01L 24/73 257/E25.013 |
| 2008/0197491 A1 * | 8/2008 | Matsui | H01L 23/60 257/E23.079 |
| 2010/0187681 A1 | 7/2010 | Chen et al. | |
| 2014/0015121 A1 | 1/2014 | Koizumi et al. | |
| 2014/0321803 A1 * | 10/2014 | Thacker | G02B 6/4274 385/14 |
| 2014/0332975 A1 | 11/2014 | Raorane et al. | |
| 2015/0228583 A1 * | 8/2015 | Karhade | H01L 23/5226 257/776 |
| 2017/0110407 A1 | 4/2017 | Chaware et al. | |
| 2018/0138146 A1 | 5/2018 | Cheah et al. | |
| 2019/0206798 A1 | 7/2019 | Collins et al. | |
| 2019/0279936 A1 * | 9/2019 | Lin | H01L 23/5385 |
| 2019/0312019 A1 | 10/2019 | Pietambaram et al. | |
| 2019/0341320 A1 | 11/2019 | Pollard et al. | |
| 2020/0058519 A1 * | 2/2020 | Tsai | H01L 25/0657 |
| 2020/0075545 A1 * | 3/2020 | Kim | H01L 25/50 |
| 2020/0135604 A1 | 4/2020 | Yen | |
| 2021/0005556 A1 * | 1/2021 | Yu | H01L 21/76802 |
| 2021/0050327 A1 * | 2/2021 | Shih | H01L 23/49838 |
| 2021/0118758 A1 * | 4/2021 | Cheng | H01L 24/32 |
| 2021/0118770 A1 * | 4/2021 | Kuo | H01L 24/16 |
| 2021/0193637 A1 | 6/2021 | Jeng et al. | |
| 2021/0305108 A1 | 9/2021 | Sankman et al. | |
| 2021/0375768 A1 | 12/2021 | Tsou et al. | |

FOREIGN PATENT DOCUMENTS

| | | |
|---|---|---|
| JP | 2017505539 A | 2/2017 |
| JP | 2017183714 A | 10/2017 |
| JP | 2018523925 A | 8/2018 |
| JP | 2019125779 A | 7/2019 |
| JP | 2021100099 | 7/2021 |
| KR | 100852766 | 8/2008 |
| TW | 200917441 A | 4/2009 |
| TW | 202139402 | 10/2021 |
| WO | 2017111957 | 6/2017 |
| WO | 2019132965 | 7/2019 |

* cited by examiner

EMBEDDED DIE ARCHITECTURE AND METHOD OF MAKING

BACKGROUND

Microelectronics typically include a central processing unit (CPU). To enhance performance, CPU products are increasingly integrating multi-die into CPU packages in the form of side-by-side or other multi-chip modules (MCMs). Embedded Multi-die Interconnect Bridging (EMIB) is the way to electrically connect multiple dies within a microelectronic package.

BRIEF DESCRIPTION OF THE FIGURES

The drawings illustrate generally, by way of example, but not by way of limitation, various examples of the present invention.

DETAILED DESCRIPTION OF THE INVENTION

Figure 1:
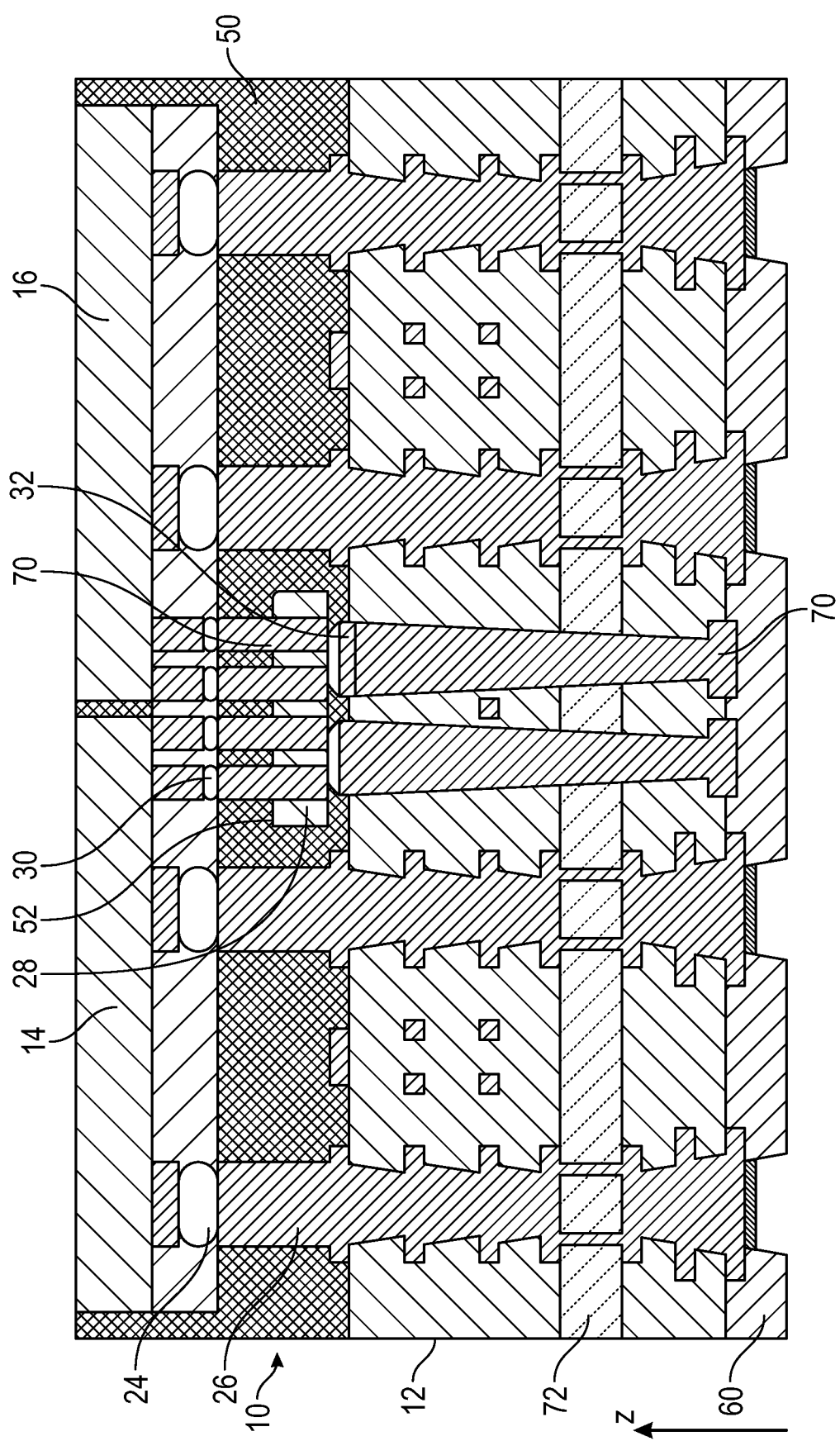
FIG. 1 is sectional view of a semiconductor package assembly, in accordance with various examples.

Reference will now be made in detail to certain examples of the disclosed subject matter, examples of which are illustrated in part in the accompanying drawings. While the disclosed subject matter will be described in conjunction with the enumerated claims, it will be understood that the exemplified subject matter is not intended to limit the claims to the disclosed subject matter.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" or "at least one of A or B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts can be carried out in any order without departing from the principles of the invention, except when a temporal or operational sequence is explicitly recited. Furthermore, specified acts can be carried out concurrently unless explicit claim language recites that they be carried out separately. For example, a claimed act of doing X and a claimed act of doing Y can be conducted simultaneously within a single operation, and the resulting process will fall within the literal scope of the claimed process.

The term "about" as used herein can allow for a degree of variability in a value or range, for example, within 10%, within 5%, or within 1% of a stated value or of a stated limit of a range, and includes the exact stated value or range. The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%. The term "substantially free of" as used herein can mean having none or having a trivial amount of, such that the amount of material present does not affect the material properties of the composition including the material, such that about 0 wt % to about 5 wt % of the composition is the material, or about 0 wt % to about 1 wt %, or about 5 wt % or less, or less than, equal to, or greater than about 4.5 wt %, 4, 3.5, 3, 2.5, 2, 1.5, 1, 0.9, 0.8, 0.7, 0.6, 0.5, 0.4, 0.3, 0.2, 0.1, 0.01, or about 0.001 wt % or less, or about 0 wt %.

FIG. 1 is a cross-sectional diagram of a semiconductor device using an Embedded Multi-die Interconnect Bridge (EMIB™) architecture. In one example, device or package 10 is formed from substrate 12 that is connected to an embedded patterned or bridge die 28, which serves as a communication pathway for the functional surface dies 14 and 16. In some examples bridge die 28 can be replaced with an interposer that fully contacts the bottom surface of dies 14 and 16. Although not shown, a cover can encase substrate 12 and dies 14 and 16. A cooling solution such as cooling fins can be attached to the top of the cover too. A variety of different cooling solutions may be used such as conductive plates, integrated heat spreaders, liquid cooling, heat pipes, or radiative fins as shown depending on the particular example. Alternatively, the device may be fabricated without the cooling solution and even without a cover.

Device substrate 12 can include internal low density interconnect routing for communicating between surface dies 14 and 16. Substrate 12 includes embedded components of a semiconductor material (e.g., a silicon, gallium, indium, germanium, or variations or combinations thereof) and one or more insulating layers, such as organic based build up film, glass-reinforced epoxy, such as FR-4, polytetrafluoroethylene (Teflon), cotton-paper reinforced epoxy (CEM-3), phenolic-glass (G3), paper-phenolic (FR-1 or FR-2), polyester-glass (CEM-5), or any other dielectric layer, that can be used in printed circuit boards (PCBs). Substrate 12 can be made using a bumpless buildup layer process (BBUL) or other technique. A BBUL process includes one or more build-up layers formed around an element, such as a high density interconnect element or bridge 28 or die 14, 16. A micro via formation process, such as laser drilling, can form connections between build-up layers and die bond pads. The build-up layers may be formed using a high-density integration patterning technology.

Device 10 can further include core 72. Core 72 can serve to reduce a mismatch in the coefficient of thermal expansion of various components of device 10. Core 72 furthermore, can be helpful to reinforce device 10. Core 72 can include many suitable materials or mixture of materials. For example, core 72 can include a dielectric organic material such as an organic based build up film, polytetrafluoroethylene (Teflon), cotton-paper reinforced epoxy (CEM-3), paper-phenolic (FR-1 or FR-2), or an epoxy. Core 72 can also include a glass such as a soda-lime glass, borosilicate glass, alumino-silicate glass, alkali-borosilicate glass, aluminoborosilcate glass, an alkalialuminosilicate glass, or a mixture thereof.

Dies or electronic components 14 and 16 can be many types of dies or electronic components. In one example, dies or electronic components 14 and 16 can be a multi-die component package, a silicon die, a resistor, a capacitor, or an inductor. In some examples, dies 14 or 16 can be a central processing unit, a flash memory, a wireless charger, a power management integrated circuit (PMIC), a Wi-Fi transmitter, a global positioning system, an application specific integrated circuit, a transceiver, a high band width memory, an IO circuit, or a NAND memory stack. In a further example die 14 or 16 can be a memory die and die 16 can be a central processing unit (CPU) die. In other examples both dies 14 and 16 can be memory dies or CPU dies. Dies 14 and 16 are coupled through C4 bumps 24 and vias 26 to a power source or bus 60. While only one C4 bump 24 is shown for each die, 14, 16 coupled to a single via 26, there may be many connection points for each die 14, 16 coupled through many vias 26 to connect the dies with the device and to external circuitry. The overall package 10 may be connected directly to a printed circuit board (PCB) or coupled to a socket that is attached to some other device such as another (PCB).

Dies 14 and 16 can include a low density interconnect pad, such as can be used for power, ground, or other electrical coupling. A low density interconnect pad can be electrically coupled to bus 60 such as a power, ground, or data bus. The low density interconnect pad can also be electrically coupled to an electrically conductive pad, such as through conductive adhesive (not shown). The conductive adhesive can be solder (e.g., solder paste), electroplating, or microball, such as a microball configured for flip device interconnect (e.g., controlled collapse device connection (C4) interconnect).

As shown, bridge die 28 is located on top of substrate 12. Bridge die 28 can also be known as an interconnect bridge. Bridge die 28 is made of silicon and has a silica surface. Bridge die 28 connects to CPU die 16 and memory die 14 through bumps 30 and 32 bumps.

In one example, as shown in FIG. 1, CPU die 16 has first interconnect area closest to memory 14 for connecting through the embedded bridge die 28 to memory 14. CPU 16 has second interconnect area for connecting with external vias 26 for power and external data input and output. Second interconnect area may be divided into power interconnect areas and data interconnect areas. In some further examples, bridge die 28 can be one of a plurality of bridge dies 28. In some of these examples, bridge die 28 may only be directly coupled to one of dies 14 or 16.

Bridge die 28 includes bumps 30 at least partially on or in a top surface of bridge die 28. The electrically conductive pads can include conductive metal, such as copper, gold, silver, aluminum, zinc, nickel, brass, bronze, iron, and the like.

Substrate 12 and bridge die 28 includes through silicon vias 70. Through silicon vias 70 extend in the z-direction from bus 60 and through substrate 12 and bridge die 28. Through silicon vias 70 can fully extend between the opposed major surfaces of bridge die 28 to connect to bumps 30. Through silicon vias can include any electronically conductive material such as copper. Through silicon vias 70 can be shaped to have a substantially circular or polygonal profile. Examples of substantially circular profiles can include a circular or elliptical profile. Examples of polygonal profiles can include a substantially quadrilateral, pentagonal, hexagonal, heptagonal profile or any other higher order polygonal profile. Through silicon vias 70 can have a substantially constant cross-sectional shape or it can vary such that through silicon vias 70 have a tapered or curved profile. The tapered profile can conform to an hour-glass shape.

As a result of extending through substrate 12, through silicon vias 70 have a non 1:1 aspect ratio. For example, the aspect ratio can be in a range of from about 1.5:1 to about 10:1 about 2:1 to about 5:1, less than, equal to, or greater than about 1.5:1, 2:1, 2.5:1, 3:1, 3.5:1, 4:1, 4.5:1, 5:1, 5.5:1, 6:1, 6.5:1, 7:1, 7.5:1, 8:1, 8.5:1, 9:1, 9.5:1, or about 10:1. An overall length of through silicon via 70, measured in the z-direction can be in a range of from about 10 μm to about 50 μm to about 30 μm to about 40 μm, less than, equal to, or greater than about 10 μm, 15, 20, 25, 30, 35, 40, 45, or about 50 μm.

Including through silicon vias 70 allows for power to be delivered directly from bus 60 through bridge die 28 and to dies 14 and 16. Power can additionally be routed directly to dies 14 and 16 through silicon vias 26. However, direct routing of power to bridge die 28 by through silicon vias 70 can have an added benefit where it is not necessary curve or bend vias 26 to supply power to bridge die 28. This can reduce the overall height in the z-direction of package 10. Additionally, placing bridge die 28 directly on substrate 12 obviates the need to form a cavity in substrate 12, thus simplifying the manufacturing protocol needed to assemble package 10.

In one example, dielectric layer 50 can be formed over bridge die 28 and substrate 12. Dielectric layer 50 allows for dimensional variations in the placement, and embedding, the bridge and electrically isolates all of the interconnection areas. Dielectric layer 50 can be formed from an epoxy-based resin such as bisphenol A, epoxy resin, a bisphenol F epoxy resin, a novolac epoxy resin, an aliphatic epoxy resin, a glycidylamine epoxy resin, and a glycidylamine epoxy resin, or any other resin including one or more terminal epoxy groups. In some examples dielectric layer 50 includes one layer having a thickness ranging from about 5 microns to about 50 microns or about 15 microns to 45 microns, or from 20 microns to 35 microns or about 30, or less than, equal to, or greater than about 15 microns, 20 microns, 25 microns, 30 microns, 35 microns, 40, microns, or 45 microns.

A surface of dielectric layer 50 and a surface of bridge die 28 are joined at interface 52. Dielectric layer 50 can be formed from an epoxy based resin and bridge die 28 can be formed from silicon and has a silica surface. Thus, interface 52 can be formed from two dissimilar materials. In order to adhere dielectric layer 50 and bridge die 28, an adhesion promotor layer can be applied to interface 52. The interface can include an adhesion promotor layer that can be formed from a plurality of silane based adhesion promotor molecules that include a silicon atom bonded to an organic group and three hydroxyl groups.

In some examples of the present invention dielectric layer 50 can be formed from multiple layers of material. For example, dielectric layer 50 can be formed from a base layer of epoxy resin or other dielectric layer as described above and further can include a second layer of epoxy-based resin that is bonded to the base layer. The second layer of epoxy based resin can have a thickness ranging from about 1 micron to about 5 microns, or about 2 microns to about 4 microns, or less than, equal to, or greater than about 1.2 microns, 1.4 microns, 1.6 microns, 1.8 microns, 2.0 microns, 2.2 microns, 2.4 microns, 2.6 microns, 2.8 microns, 3.0 microns, 3.2 microns, 3.4 microns, 3.6 microns, 3.8 microns, 4 microns, 4.2 microns, 4.4 microns, 4.6 microns, or 4.8 microns. In some examples the adhesion promoting molecules can be bonded to the second layer of epoxy-based resin prior to lamination of dielectric layer 50 onto bridge die 28. In this manner the second layer of epoxy-based resin serves as a primer layer for adhesion between dielectric layer 50 and bridge die 28.

Semiconductor package 10 can be formed according to any suitable method. As an example of a suitable method, a plurality holes can be formed in substrate 12 by laser etching. Through silicon vias 70 can be grown vertically to a desired length from bus 60 through the holes. Portions of the through silicon vias 70 extending from substrate 12 can be encased in a dielectric material and planarized expose the top portion of through silicon vias 70 and solder balls 32 can be grown thereon. A portion of the dielectric material can be etched away and bridge die 28 can be placed in the etched portion with through silicon vias 70 extending therethrough. Dies 14 and 16 can then be attached to solder balls 32. The assembly can then be at least partially encased in an overmold material and optional elements such as a heat spreader can be attached to the mold.

Figure 2:
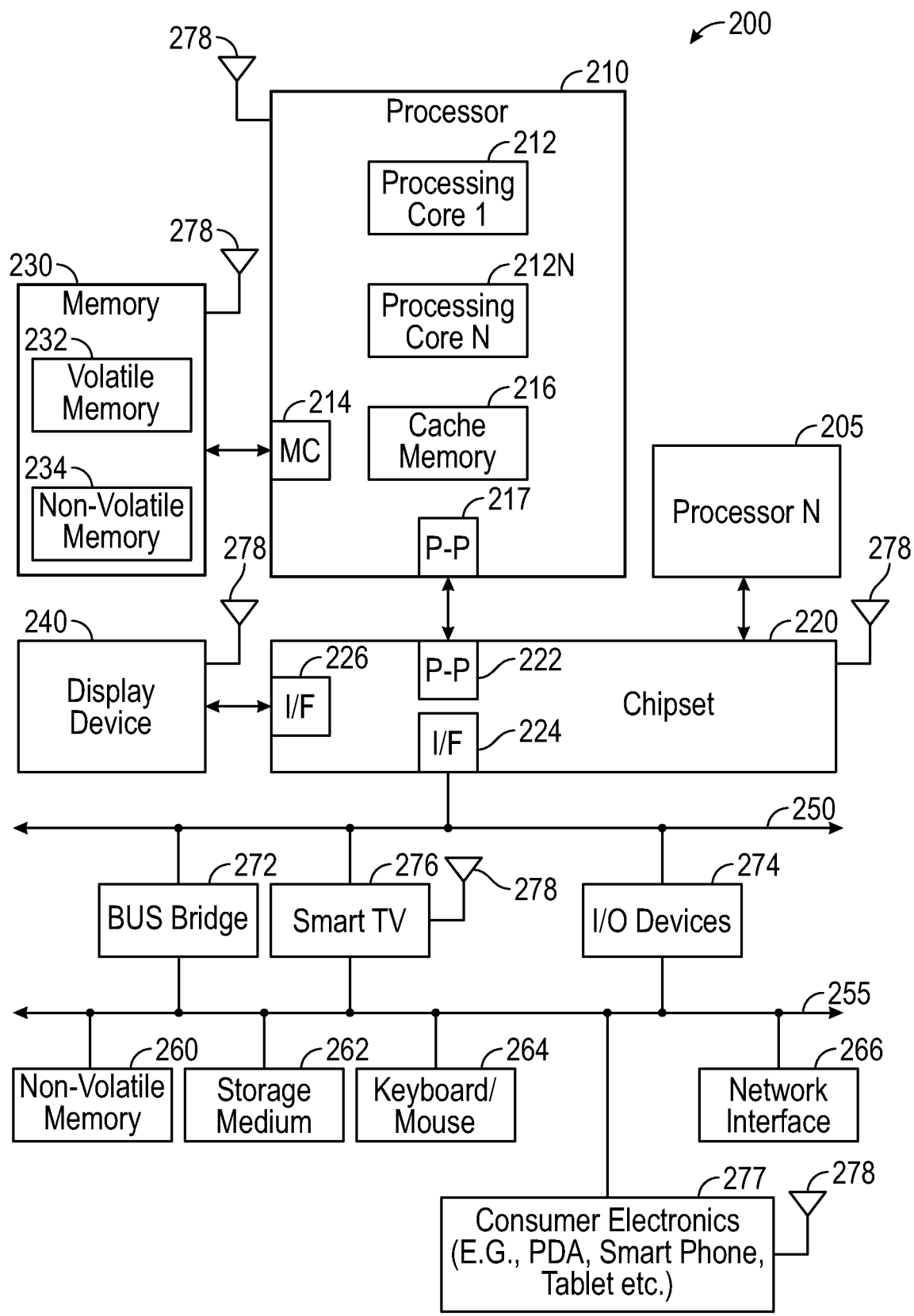
FIG. 2 is a system level diagram of a system that can include a semiconductor package assembly, in accordance with various examples.

Semiconductor device 10 can be incorporated into many different electronic devices. EMIB™ is one such technology incorporating device 10, which provides integration of different components into one package through ultra-high density interconnections. FIG. 2 illustrates a system level diagram, according to an example of the invention. For instance, FIG. 2 depicts an example of an electronic device (e.g., system) including IC package assembly 200; FIG. 2 is included to show an example of a higher level device application for the present inventive subject matter. In an example, system 200 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some examples, system 200 is a system on a chip (SOC) system.

In an example, processor 210 has one or more processing cores 212 and 212N, where 212N represents the Nth processor core inside processor 210 where N is a positive integer. In an example, system 200 includes multiple processors including 210 and 205, where processor 205 has logic similar or identical to the logic of processor 210. In some examples, processing core 212 includes, but is not limited to, pre-fetch logic to fetch instructions, decode logic to decode the instructions, execution logic to execute instructions, and the like. In some examples, processor 210 has a cache memory 216 to cache instructions and/or data for system 200. Cache memory 216 may be organized into a hierarchal structure including one or more levels of cache memory.

In some examples, processor 210 includes a memory controller 214, which is operable to perform functions that enable the processor 210 to access and communicate with memory 230 that includes a volatile memory 232 and/or a non-volatile memory 234. In some examples, processor 210 is coupled with memory 230 and chipset 220. Processor 210 may also be coupled to a wireless antenna 278 to communicate with any device configured to transmit and/or receive wireless signals. In an example, the wireless antenna 278 operates in accordance with, but is not limited to, the IEEE 802.11 standard and its related family, Home Plug AV (HPAV), Ultra Wide Band (UWB), Bluetooth, WiMax, or any form of wireless communication protocol.

In some examples, volatile memory 232 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 234 includes, but is not limited to, flash memory, phase change memory (PCM), read-only memory (ROM), electrically erasable programmable read-only memory (EEPROM), or any other type of non-volatile memory device.

Memory 230 stores information and instructions to be executed by processor 210. In an example, memory 230 may also store temporary variables or other intermediate information while processor 210 is executing instructions. In the illustrated example, chipset 220 connects with processor 210 via Point-to-Point (PtP or P-P) interfaces 217 and 222. Chipset 220 enables processor 210 to connect to other elements in system 200. In some examples of the invention, interfaces 217 and 222 operate in accordance with a PtP communication protocol such as the Intel® QuickPath Interconnect (QPI) or the like. In other examples, a different interconnect may be used.

In some examples, chipset 220 is operable to communicate with processor 210, 205N, display device 240, and other devices 272, 276, 274, 260, 262, 264, 266, 277, etc. Chipset 220 may also be coupled to a wireless antenna 278 to communicate with any device configured to transmit and/or receive wireless signals.

Chipset 220 connects to display device 240 via interface 226. Display device 240 may be, for example, a liquid crystal display (LCD), a plasma display, cathode ray tube (CRT) display, or any other form of visual display device. In some examples of the invention, processor 210 and chipset 220 are merged into a single SOC. In addition, chipset 220 connects to one or more buses 250 and 255 that interconnect various elements 274, 260, 262, 264, and 266. Buses 250 and 255 may be interconnected together via a bus bridge 272. In an example, chipset 220 couples with a non-volatile memory 260, a mass storage device(s) 262, a keyboard/mouse 264, and a network interface 266 via interface 224 and/or 226, smart TV 276, consumer electronics 277, etc.

In an example, mass storage device 262 includes, but is not limited to, a solid state drive, a hard disk drive, a universal serial bus flash memory drive, or any other form of computer data storage medium. In an example, network interface 266 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In an example, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 2 are depicted as separate blocks within the system 200, the functions performed by some of these blocks may be integrated within a single semiconductor circuit or may be implemented using two or more separate integrated circuits. For example, although cache memory 216 is depicted as a separate block within processor 210, cache memory 216 (or selected aspects of cache memory 216) may be incorporated into processing core 212.

EXEMPLARY EXAMPLES

The following exemplary examples are provided, the numbering of which is not to be construed as designating levels of importance:

Example 1 provides a semiconductor package comprising:
a substrate having first and second opposed substantially planar major surfaces extending in an x-y direction;
a bridge die having third and fourth opposed substantially planar major surfaces extending in the x-y direction, wherein the third substantially planar major surface of the bridge die is in direct contact with the second substantially planar major surface of the substrate;
a through silicon via extending in a z-direction through the first substantially planar major surface of the substrate and the fourth substantially planar major surface of the bridge die;
a power source coupled to the through silicon via;
a first electronic component electronically and a second electronic component at least one of which electronically coupled to the bridge die; and
an overmold at least partially encasing the first electronic component, second electronic component, and the bridge die.

Example 2 provides the semiconductor package of Example 1, wherein the substrate comprises conducing layers dispersed within silicon.

Example 3 provides the semiconductor package of any one of Examples 1 or 2, wherein the through silicon via comprises a conducting material.

Example 4 provides the semiconductor package of Example 3, wherein the conducting material is copper.

Example 5 provides the semiconductor package of any one of Examples 1-4, wherein the through silicon via comprises a polygonal profile.

Example 6 provides the semiconductor package of Example 5, wherein the polygonal profile is substantially circular, substantially elliptical, substantially square, or substantially rectangular.

Example 7 provides the semiconductor package of any one of Examples 1-6, wherein the first and second electronic components independently comprise a multi-die component package, a silicon die, a resistor, a capacitor, or an inductor.

Example 8 provides the semiconductor package of Example 7, wherein the multi-die component package is a NAND memory stack.

Example 9 provides the semiconductor package of any one of Examples 7 or 8, wherein the silicon die comprises a central processing unit, a flash memory, a wireless charger, a power management integrated circuit (PMIC), a Wi-Fi transmitter, a global positioning system, an application specific integrated circuit, or a NAND memory stack.

Example 10 provides the semiconductor package of any one of Examples 1-9, further comprising a plurality of solder balls attached to the fourth major surface of the substrate and to the first and second electronic components.

Example 11 provides the semiconductor package of Example 10, wherein an average pitch of the solder balls is in a range of from about 5 µm to about 50 µm.

Example 12 provides the semiconductor package of Example 10, wherein an average pitch of the solder balls is in a range of from about 20 µm to about 40 µm.

Example 13 provides the semiconductor package of any one of Examples 1-12, wherein a height of the through silicon via is in a range of from about 10 µm to about 50 µm.

Example 14 provides the semiconductor package of any one of Examples 1-13, wherein a height of the through silicon via is in a range of from about 30 µm to about 40 µm.

Example 15 provides the semiconductor package of any one of Examples 1-14, wherein the through silicon via is a through silicon via and is coupled to a solder ball adjacent to the fourth major surface of the embedded die.

Example 16 provides the semiconductor package of any one of Examples 1-15, wherein the through silicon via has a high aspect ratio in the z-direction.

Example 17 provides the semiconductor package of Example 16, wherein the aspect ratio is in a range of from about 1.5:1 to about 10:1.

Example 18 provides the semiconductor package of any one of Examples 16 or 17, wherein the aspect ratio is in a range of from about 2:1 to about 5:1.

Example 19 provides the semiconductor package of any one of Examples 1-18, wherein a thickness of the substrate is substantially constant in the x-y direction.

Example 20 provides the semiconductor package of any one of Examples 1-19, wherein the substrate is free of a cavity.

Example 21 provides the semiconductor package of any one of Examples 1-20, further comprising a core attached to the substrate comprising an organic material, a glass material, or both.

Example 22 provides a semiconductor package comprising:
a substrate having first and second opposed substantially planar major surfaces extending in an x-y direction;
a bridge die having third and fourth opposed substantially planar major surfaces extending in the x-y direction, wherein the third substantially planar major surface of the bridge die is in direct contact with the second substantially planar major surface of the substrate;
a through silicon via extending in a z-direction through the first substantially planar major surface of the substrate and the fourth substantially planar major surface of the bridge die, the through silicon via having an aspect ratio in a range of from about 1.5:1 to about 10:1 and is coupled to a solder ball adjacent to the fourth major surface of the embedded die;
a power source coupled to the through silicon via;
a first electronic component electronically coupled to the bridge die;
a second electronic component electronically coupled to the bridge die; and
an overmold at least partially encasing the first electronic component, second electronic component, and the bridge die.

Example 23 provides the semiconductor package of Example 22, wherein the substrate comprises conducing layers dispersed within silicon.

Example 24 provides the semiconductor package of any one of Examples 22 or 23, wherein the through silicon via comprises a conducting material.

Example 25 provides the semiconductor package of Example 24, wherein the conducting material is copper.

Example 26 provides the semiconductor package of any one of Examples 22-25, wherein the through silicon via comprises a polygonal profile.

Example 27 provides the semiconductor package of Example 26, wherein the polygonal profile is substantially circular, substantially elliptical, substantially square, or substantially rectangular.

Example 28 provides the semiconductor package of any one of Examples 22-27, wherein the first and second electronic components independently comprise a multi-die component package, a silicon die, a resistor, a capacitor, or an inductor.

Example 29 provides the semiconductor package of Example 28, wherein the multi-die component package is a NAND memory stack.

Example 30 provides the semiconductor package of any one of Examples 28 or 29, wherein the silicon die comprises a central processing unit, a flash memory, a wireless charger, a power management integrated circuit (PMIC), a Wi-Fi transmitter, a global positioning system, an application specific integrated circuit, or a NAND memory stack.

Example 31 provides the semiconductor package of any one of Examples 22-30, further comprising a plurality of solder balls attached to the fourth major surface of the substrate and to the first and second electronic components.

Example 32 provides the semiconductor package of Example 31, wherein an average pitch of the solder balls is in a range of from about 5 µm to about 50 µm.

Example 33 provides the semiconductor package of Example 31, wherein an average pitch of the solder balls is in a range of from about 20 µm to about 40 µm.

Example 34 provides the semiconductor package of any one of Examples 22-33, wherein a height of the through silicon via is in a range of from about 10 µm to about 50 µm.

Example 35 provides the semiconductor package of any one of Examples 22-34, wherein a height of the through silicon via is in a range of from about 30 µm to about 40 µm.

Example 36 provides the semiconductor package of any one of Examples 22-35, wherein the through silicon via is a through silicon via and is coupled to a solder ball adjacent to the fourth major surface of the embedded die.

Example 37 provides the semiconductor package of any one of Examples 22-36, wherein the through silicon via has a high aspect ratio in the z-direction.

Example 38 provides the semiconductor package of Example 37, wherein the aspect ratio is in a range of from about 1.5:1 to about 10:1.

Example 39 provides the semiconductor package of Example 37, wherein the aspect ratio is in a range of from about 2:1 to about 5:1.

Example 40 provides the semiconductor package of any one of Examples 22-39, wherein a thickness of the substrate is substantially constant in the x-y direction.

Example 41 provides the semiconductor package of any one of Examples 22-40, wherein a thickness of the embedded die is substantially constant in the x-y direction.

Example 42 provides the semiconductor package of any one of Examples 22-41, wherein the substrate is free of a cavity.

Example 43 provides a method of forming the semiconductor package of any one of Examples 1-42, the method comprising:

growing a plurality of through silicon vias extending in a z-direction from a substrate having first and second opposed substantially planar major surfaces extending in an x-y direction;

contacting a bridge die having third and fourth opposed substantially planar major surfaces extending in the x-y direction with the second substantially planar major surface of the substrate such that the plurality of through silicon vias extend in a z-direction through the first substantially planar major surface of the substrate and the fourth substantially planar major surface of the bridge die;

growing a plurality of solder balls on the plurality of through silicon vias;

attaching a first electronic component and a second electronic component to the solder balls;

coupling a power source to the plurality of through silicon via; and at least partially encapsulating the semiconductor package with an overmold.

Example 44 provides the method of Example 43, wherein the substrate comprises conducing layers dispersed within silicon.

Example 45 provides the method of any one of Examples 43 or 44, wherein the through silicon via comprises a conducting material.

Example 46 provides the method of Example 45, wherein the conducting material is copper.

Example 47 provides the method of any one of Examples 43-46, wherein the through silicon via comprises a polygonal profile.

Example 48 provides the method of Example 47, wherein the polygonal profile is substantially circular, substantially elliptical, substantially square, or substantially rectangular.

Example 49 provides the method of any one of Examples 43-48, wherein the first and second electronic components independently comprise a multi-die component package, a silicon die, a resistor, a capacitor, or an inductor.

Example 50 provides the method of Example 49, wherein the multi-die component package is a NAND memory stack.

Example 51 provides the method of any one of Examples 49 or 50, wherein the silicon die comprises a central processing unit, a flash memory, a wireless charger, a power management integrated circuit (PMIC), a Wi-Fi transmitter, a global positioning system, an application specific integrated circuit, or a NAND memory stack.

Example 52 provides the method of any one of Examples 43-51, further comprising a plurality of solder balls attached to the fourth major surface of the substrate and to the first and second electronic components.

Example 53 provides the method of Example 52, wherein an average pitch of the solder balls is in a range of from about 5 µm to about 50 µm.

Example 54 provides the method of Example 52, wherein an average pitch of the solder balls is in a range of from about 20 µm to about 40 µm.

Example 55 provides the method of any one of Examples 43-54, wherein a height of the through silicon via is in a range of from about 10 µm to about 50 µm.

Example 56 provides the method of any one of Examples 43-55, wherein a height of the through silicon via is in a range of from about 30 µm to about 40 µm.

Example 57 provides the method of any one of Examples 43-56, wherein the through silicon via is a through silicon via and is coupled to a solder ball adjacent to the fourth major surface of the embedded die.

Example 58 provides the method of any one of Examples 43-57, wherein the through silicon via has a high aspect ratio in the z-direction.

Example 59 provides the method of Example 58, wherein the aspect ratio is in a range of from about 1.5:1 to about 10:1.

Example 60 provides the method of Example 58, wherein the aspect ratio is in a range of from about 2:1 to about 5:1.

Example 61 provides the method of any one of Examples 43-60, wherein a thickness of the substrate is substantially constant in the x-y direction.

Example 62 provides the method of any one of Examples 43-61, wherein a thickness of the embedded die is substantially constant in the x-y direction.

Example 63 provides the method of any one of Examples 43-62, wherein the substrate is free of a cavity.

Example 64 provides the method of any one of Examples 43-63, further comprising planarizing the substrate.

What is claimed is:

1. A semiconductor package, comprising:
a core comprising a glass;
a substrate, comprising:
embedded components comprising one or more semiconductor materials, and one or more insulating layers;
a first die comprising a plurality of vias extending from one surface of the first die to an opposite surface of the first die, wherein a first portion of the substrate is between the core and the first die, and the core is between a second portion of the substrate and the first portion of the substrate;
a second die over a first portion of the first die and coupled to a first via of the plurality of vias of the first die;
a third die over a second portion of the first die and coupled to a second via of the plurality of vias of the first die;
a third via extending through an entire thickness of the core and an entire thickness of the substrate; and
a fourth via extending through the entire thickness of the core and the entire thickness of the substrate,
wherein the third via is coupled to the first via, and the fourth via is coupled to the second via.

2. The semiconductor package of claim 1, wherein the third via comprises an electrically conductive material.

3. The semiconductor package of claim 1, wherein a height of the third via is in a range from about 10 µm to about 50 µm.

4. The semiconductor package of claim 1, further comprising an insulator material at least partially enclosing the first die and the second die.

5. The semiconductor package of claim 1, further comprising an insulator material at least partially enclosing the first die, the second die, and the third die.

6. The semiconductor package of claim 1, wherein the first portion of the first die and the second portion of the first die are different portions of the first die.

7. The semiconductor package of claim 1, further comprising a bus, wherein the second portion of the substrate is between the bus and the core.

8. The semiconductor package of claim 7, further comprising a conductive interconnect extending from the bus, through the second portion of the substrate, through the core, and through the first portion of the substrate to a surface of the first portion of substrate.

9. The semiconductor package of claim 8, further comprising a dielectric layer between the first portion of the substrate and the second die, wherein the conductive interconnect further extends from the surface of the first portion of the substrate through the dielectric layer and to a conductive contact at a bottom of the second die.

10. The semiconductor package of claim 1, wherein the third via extending through the entire thickness of the core and the entire thickness of the substrate includes the third via extending through an entire thickness of the second portion of the substrate, through the core, and through an entire thickness of the first portion of the substrate.

11. A semiconductor package, comprising:
a package substrate comprising a semiconductor material and conductive layers dispersed within the semiconductor material, wherein a glass structure is embedded in the package substrate;
a first die coupled to the package substrate, wherein a portion of the package substrate is between the glass structure and the first die;
an electrically continuous conductive pathway extending through the glass structure, the package substrate, and the first die in a direction substantially perpendicular to one of surfaces of the package substrate;
a second die partially overlapping with a first portion of the first die;
a third die partially overlapping with a second portion of the first die;
a first conductive pathway coupling the first die and the second die; and
a second conductive pathway coupling the first die and the third die.

12. The semiconductor package of claim 11, wherein the electrically continuous conductive pathway has an aspect ratio in a range from about 1.5:1 to about 10:1 and is coupled to a solder ball adjacent to a surface of the first die that is opposite to one of surfaces of the first die.

13. The semiconductor package of claim 11, further comprising an electronic component coupled to the first die, wherein the electronic component includes one or more of a multi-die component package, a resistor, a capacitor, or an inductor.

14. The semiconductor package of claim 13, further comprising an insulator material at least partially enclosing the electronic component and the first die.

15. The semiconductor package of claim 11, further comprising:
an insulator material surrounding sidewalls of the first die;
a third conductive pathway extending through the insulator material in a direction substantially perpendicular to the one of surfaces of the package substrate, wherein the third conductive pathway is between a first portion of the package substrate and the second die; and
a fourth conductive pathway extending through the insulator material in a direction substantially perpendicular to the one of surfaces of the package substrate, wherein the fourth conductive pathway is between a second portion of the package substrate and the third die,
wherein the first portion of the package substrate and the second portion of the package substrate are different portions of the package substrate.

16. The semiconductor package of claim 11, at least a portion of the second die and at least a portion of the third die are in a single plane substantially perpendicular to the one of surfaces of the package substrate.

17. A semiconductor package, comprising:
a package substrate structure, comprising:
a substrate comprising a semiconductor material and layers that include one or more electrically conductive materials, wherein the layers are embedded in the semiconductor material,
a glass layer between a first portion of the substrate and a second portion of the substrate, and
a dielectric layer, wherein the first portion of the substrate is between the glass layer and the dielectric layer;
a die embedded in the dielectric layer of the package substrate structure;
an electrically continuous conductive pathway extending through the die and the substrate of the package substrate structure in a direction substantially perpendicular to the substrate of the package substrate structure;
a first electronic component coupled to the die and partially overlapping with a first portion of the die; and
a second electronic component coupled to the die and partially overlapping with a second portion of the die.

18. The semiconductor package of claim 17, wherein:

each of the die and the dielectric layer includes a first surface and a second surface opposite to the first surface, the first surface of the die is closer to the first surface of the dielectric layer than the second surface of the die, the first surface of the die is closer to the substrate than the second surface of the die, the semiconductor package further includes a first conductive interconnect extending from the first surface of the die to the second surface of the dielectric layer, and the semiconductor package further includes a second conductive interconnect extending from the first surface of the die to the second surface of the dielectric layer.

19. The semiconductor package of claim 18, wherein the first conductive interconnect couples the first electronic component to the die and the second conductive interconnect couples the second electronic component to the die.

20. The semiconductor package of claim 17, wherein:

each of the die and the dielectric layer includes a first surface and a second surface opposite to the first surface, the first surface of the die is closer to the first surface of the dielectric layer than the second surface of the die, the first surface of the die is closer to the substrate than the second surface of the die, a first portion of the dielectric layer separates the die from the first surface of the dielectric layer, and a second portion of the dielectric layer separates the die from the second surface of the dielectric layer.

21. The semiconductor package of claim 17, further comprising an insulator material at least partially enclosing the first electronic component, the second electronic component, and the die.

22. The semiconductor package of claim 17, wherein at least a portion of the first electronic component and at least a portion of the second electronic component are in a single plane substantially perpendicular to the substrate of the package substrate structure.

* * * * *